United States Patent
Kwak et al.

(10) Patent No.: US 7,960,746 B2
(45) Date of Patent: *Jun. 14, 2011

(54) LOW RESISTANCE ELECTRODE AND COMPOUND SEMICONDUCTOR LIGHT EMITTING DEVICE INCLUDING THE SAME

(75) Inventors: Joon-seop Kwak, Gyeonggi-do (KR); Tae-yeon Seong, Gwangju-si (KR); Jae-hee Cho, Gyeonggi-do (KR); June-o Song, Gwangju-si (KR); Dong-seok Leem, Gwangju-si (KR); Hyun-soo Kim, Gyeonggi-do (KR)

(73) Assignee: Samsung LED Co., Ltd., Suwon-si, Gyeonggi-do (KR)

( * ) Notice: Subject to any disclaimer, the term of this patent is extended or adjusted under 35 U.S.C. 154(b) by 155 days.

This patent is subject to a terminal disclaimer.

(21) Appl. No.: 10/979,240

(22) Filed: Nov. 3, 2004

(65) Prior Publication Data

US 2005/0145876 A1 Jul. 7, 2005

(30) Foreign Application Priority Data

Jan. 6, 2004 (KR) .......... 10-2004-0000567
Aug. 4, 2004 (KR) .......... 10-2004-0061429

(51) Int. Cl.
| | |
|---|---|
| H01L 33/00 | (2010.01) |
| H01L 23/48 | (2006.01) |
| H01L 23/52 | (2006.01) |
| H01L 23/40 | (2006.01) |
| H01L 21/00 | (2006.01) |
| H01L 21/28 | (2006.01) |
| H01L 21/3205 | (2006.01) |
| H01L 21/44 | (2006.01) |

(52) U.S. Cl. .............. 257/98; 257/96; 257/99; 257/745; 257/762; 257/764; 257/766; 257/E33.025; 257/E33.063; 257/E33.064; 257/E33.068; 438/29; 438/47; 438/605; 438/608; 438/609

(58) Field of Classification Search ........................ None
See application file for complete search history.

(56) References Cited

U.S. PATENT DOCUMENTS 5,990,500 A * 11/1999 Okazaki .......................... 257/99

(Continued)

FOREIGN PATENT DOCUMENTS

JP 05-218497 * 8/1993

(Continued)

OTHER PUBLICATIONS

Ushiku et al., Planarized Silver Interconnect Technology With a Ti Self-Passivation Technique For Deep Sub-Micron ULSIs, VSLI Technology, 1993, pp. 121-122.*

(Continued)

Primary Examiner — Hoang-Quan T Ho
(74) Attorney, Agent, or Firm — Kile Park Goekjian Reed & McManus PLLC

(57) ABSTRACT

A low resistance electrode and a compound semiconductor light emitting device including the same are provided. The low resistance electrode deposited on a p-type semiconductor layer of a compound semiconductor light emitting device including an n-type semiconductor layer, an active layer, and the p-type semiconductor layer, including: a reflective electrode which is disposed on the p-type semiconductor layer and reflects light being emitted from the active layer; and an agglomeration preventing electrode which is disposed on the reflective electrode layer in order to prevent an agglomeration of the reflective electrode layer during an annealing process.

11 Claims, 13 Drawing Sheets

U.S. PATENT DOCUMENTS

| | | | |
|---|---|---|---|
| 6,969,874 B1 * | 11/2005 | Gee et al. | 257/98 |
| 7,358,541 B2 * | 4/2008 | Seong et al. | 257/98 |
| 7,372,081 B2 * | 5/2008 | Song et al. | 257/99 |
| 7,491,979 B2 * | 2/2009 | Kwak et al. | 257/98 |
| 7,737,456 B2 * | 6/2010 | Song et al. | 257/98 |
| 2003/0119273 A1 * | 6/2003 | Aggarwal et al. | 438/396 |
| 2003/0209720 A1 * | 11/2003 | Okazaki et al. | 257/98 |
| 2005/0087758 A1 * | 4/2005 | Kwak et al. | 257/99 |
| 2005/0087884 A1 * | 4/2005 | Stokes et al. | 257/778 |
| 2005/0212006 A1 * | 9/2005 | Kwak et al. | 257/99 |
| 2006/0043388 A1 * | 3/2006 | Kwak et al. | 257/80 |
| 2006/0081867 A1 * | 4/2006 | Kim et al. | 257/99 |

FOREIGN PATENT DOCUMENTS

| | | | |
|---|---|---|---|
| JP | 1993-218497 A | | 8/1993 |
| JP | 05-243610 | * | 9/1993 |
| JP | 1993-2743610 A | | 9/1993 |
| JP | 6-45651 A | | 2/1994 |
| JP | 1994-045651 | * | 2/1994 |
| JP | 10-308534 A | | 11/1998 |
| JP | 10-308535 A | | 11/1998 |
| JP | 11-111842 A | | 4/1999 |
| JP | 11-186598 A | | 7/1999 |
| JP | 2000-036619 A | | 2/2000 |
| JP | 2001-168059 A | | 6/2001 |
| JP | 2002-335014 A | | 11/2002 |
| JP | 2003-017741 | * | 1/2003 |
| JP | 2003-017741 A | | 1/2003 |
| JP | 2003-034828 A | | 2/2003 |
| JP | 2004-111760 A | | 4/2004 |
| JP | 2004-179347 A | | 6/2004 |
| WO | WO01/47038 A1 * | | 6/2001 |

OTHER PUBLICATIONS

Kang et al., Influence of Mg on resistivity, adhesion, agglomeration of Ag(Mg)/SiO2/Si multilayers, Materials Research Society, 2002, pp. A9.9.1-A9.9.6.*

Office Action issued in Chinese Patent Application No. 2004-100983663 on Jul. 20, 2007 with English Translation.

Office Action issued by Japan Patent Office on Jul. 13, 2010.

Japan Patent Office, Non-final Rejection, Appl. No. 2004-371502, dated Nov. 2, 2010.

Final Refusal, Japan Patent Office, Appln No. 2004-371502, dated Apr. 5, 2011.

* cited by examiner

TOP VIEW

TOP VIEW

SIDE VIEW

SIDE VIEW

LOW RESISTANCE ELECTRODE AND COMPOUND SEMICONDUCTOR LIGHT EMITTING DEVICE INCLUDING THE SAME

BACKGROUND OF THE DISCLOSURE

This application claims the priority of Korean Patent Application Nos. 2004-567 and 2004-61429, filed on Jan. 6 and Aug. 4, 2004, respectively, in the Korean Intellectual Property Office, the disclosure of which is incorporated herein in its entirety by reference.

1. Field of the Disclosure

The present disclosure relates to a low resistance electrode and a compound semiconductor light emitting device including the same, and more particularly, to a low resistance electrode and a compound semiconductor light emitting device including the same in which reflectivity is improved by preventing agglomeration.

2. Description of the Related Art

A semiconductor light emitting device converts an electric signal into light using properties of compound semiconductor device, such as a light emitting diode (LED). Compared with other illuminants, a semiconductor light emitting device has a long lifetime, a low driving voltage, and low power consumption. Also, a semiconductor light emitting device has excellent response speed and impact resistance and can be manufactured to be small-sized and lightweight. A semiconductor light emitting device can generate light at different wavelengths, depending on the semiconductor material. Thus, if necessary, light of different wavelengths can be generated and used. Specifically, with the development of production technology and improvements in device structure, high-brightness semiconductor light emitting devices have been developed and their range of applications have increased. Further, since high-brightness semiconductor light emitting devices that emit blue light were developed in the middle of the 1990's, true colors can be reproduced using red, green and blue high-brightness semiconductor light emitting devices.

FIG. 1 is a schematic view illustrating an operating principle of a conventional LED. Referring to FIG. 1, the LED includes a semiconductor light emitting device 10 formed on a sapphire substrate 40, a p-type electrode 20 formed on the semiconductor light emitting device 10, and an n-type electrode 30 formed at one corner of the semiconductor light emitting device 10. If a forward voltage is applied to the LED electrodes 20 and 30, recombination of holes from a p-type clad layer 17 and electrons from an n-type clad layer 13 in an active layer 15 results in light emission. The light that is emitted from the active layer 15 is reflected by the p-type electrode 20 and emitted out of the LED through the sapphire substrate 40. In such an LED, since the p-type electrode 20 must reflect the light, a conductive metal having a high reflectivity, such as Ag, is used as the p-type electrode 20.

A semiconductor having a large direct bandgap energy (about 2.8 eV or more) is necessary for emitting blue light. Semiconductor devices that emit blue and green light using ternary materials of groups II-VI have been developed. However, their applications are limited because of relatively short operating times. Recently, group III-V semiconductor devices that emit blue light are developed. Among them, group III nitride materials (mainly, GaN related compounds) are very stable in optical, electrical and thermal stimuli and have high luminous efficiency. Thus, the group III nitride materials are often used.

FIG. 2 illustrates a conventional p-type electrode 20, which is formed on the p-type clad layer (p-type nitride semiconductor) 17 of the nitride semiconductor light emitting device 10 in a LED that uses a group-III nitride semiconductor, such as GaN, as a semiconductor light emitting device. As described above, the p-type reflective electrode 20, which may be composed of Ag, is formed on the p-type nitride semiconductor 17. In the process of forming the p-type reflective electrode 20 on the p-type nitride semiconductor 17, an electrode is deposited on a p-type nitride semiconductor and an annealing process is performed to reduce resistance.

However, there is a large difference between surface energies of the nitride semiconductor and of the metal material used as the reflective electrode. Due to such a difference in the surface energy, it is generally known that agglomeration occurs in the Ag electrode during the annealing process, as illustrated in FIGS. 4A and 4C. FIGS. 4A and 4C are top and side views of the Ag electrode in which the agglomeration occurs, respectively. If such agglomeration occurs in the Ag electrode, the reflectivity of the Ag electrode is degraded, thereby reducing the overall optical power of the LED.

SUMMARY OF THE DISCLOSURE

Embodiments of the present invention may provide a low resistance electrode and a compound semiconductor light emitting device including the same, in which an agglomeration in a p-type reflective electrode is prevented, thereby preventing a reduction in optical power.

According to an aspect of the present disclosure, there may be provided a low resistance electrode deposited on a p-type semiconductor layer of a compound semiconductor light emitting device including an n-type semiconductor layer, an active layer, and the p-type semiconductor layer. The low resistance electrode includes a reflective electrode which is deposited on the p-type semiconductor layer and reflects light emitted from the active layer; and an agglomeration preventing electrode layer which is deposited on the reflective electrode layer in order to prevent an agglomeration of the reflective electrode layer during an annealing process.

In order to reduce a contact resistance between the p-type semiconductor layer and the reflective electrode layer, the low resistance electrode may further include a contact electrode layer interposed between the p-type semiconductor layer and the reflective electrode layer. The low resistance electrode may further include an oxidation preventing electrode layer which is deposited on the agglomeration preventing electrode in order to prevent oxidation of the agglomeration preventing electrode.

According to another aspect of the present disclosure, there may be provided a compound semiconductor light emitting device, including: a nitride-based compound semiconductor layer including an active layer that emits light interposed between an n-type semiconductor layer and a p-type semiconductor layer; a reflective electrode which is disposed on the p-type semiconductor layer and reflects light being emitted from the active layer; and an agglomeration preventing electrode layer which is stacked on the reflective electrode layer in order to prevent an agglomeration of the reflective electrode layer during an annealing process, wherein a difference between surface energies of the agglomeration preventing electrode layer and the p-type semiconductor layer is smaller than a difference between surface energies of the reflective electrode and the p-type semiconductor layer.

BRIEF DESCRIPTION OF THE DRAWINGS

The above and other features and advantages of the present invention will be described in detailed exemplary embodiments thereof with reference to the attached drawings in which.

DETAILED DESCRIPTION OF THE PREFERRED EMBODIMENTS

Figure 1:
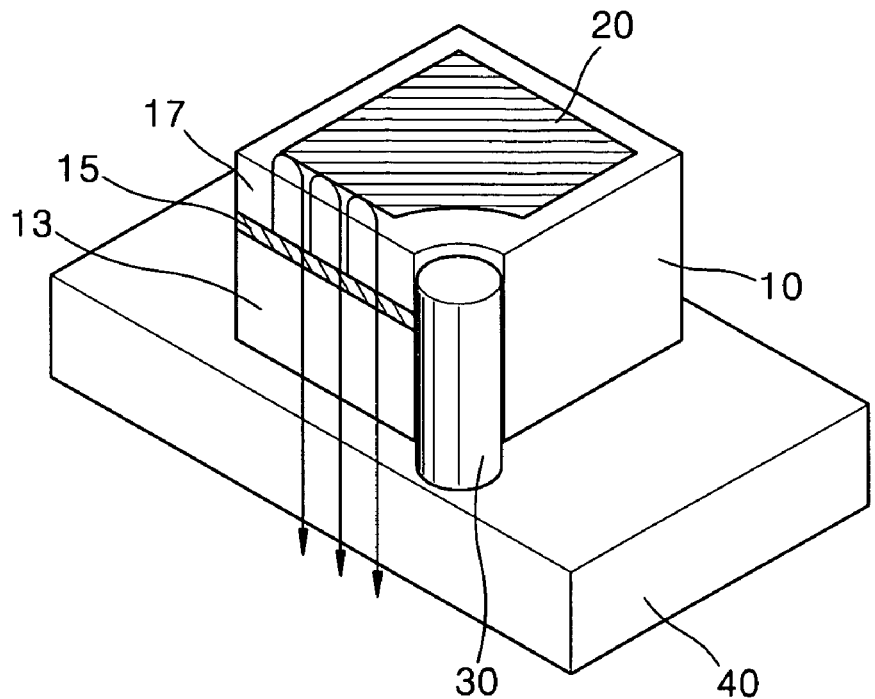
FIG. 1 is a view schematically illustrating an operating principle of a conventional light emitting device.
Figure 2:
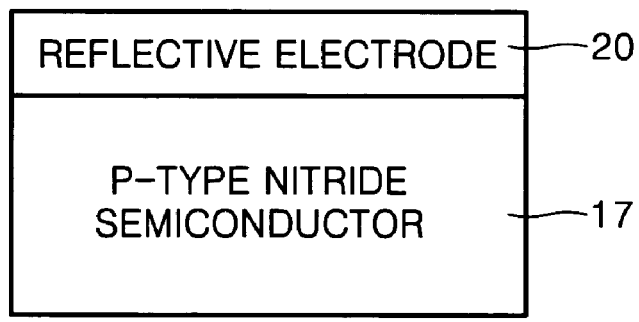
FIG. 2 is a view of a conventional p-type electrode formed on a compound semiconductor light emitting device.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. Like reference numerals in the drawings denote like elements, and thus their description will be omitted.

Figure 3A:
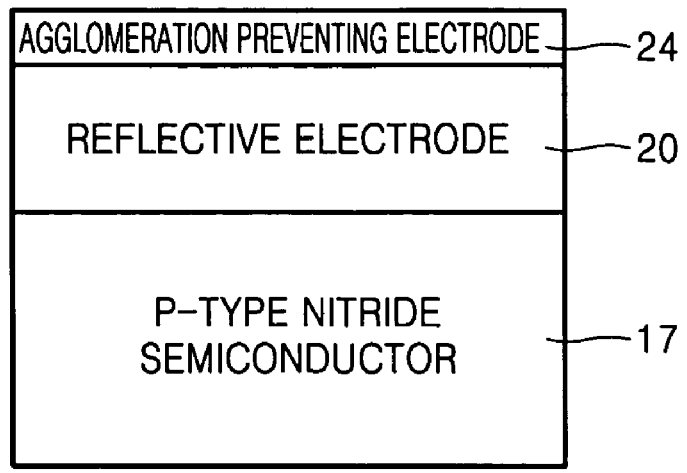
FIGS. 3A and 3B are schematic views of a p-type electrode formed on a compound semiconductor light emitting device according to embodiments of the present invention.
Figure 3B:
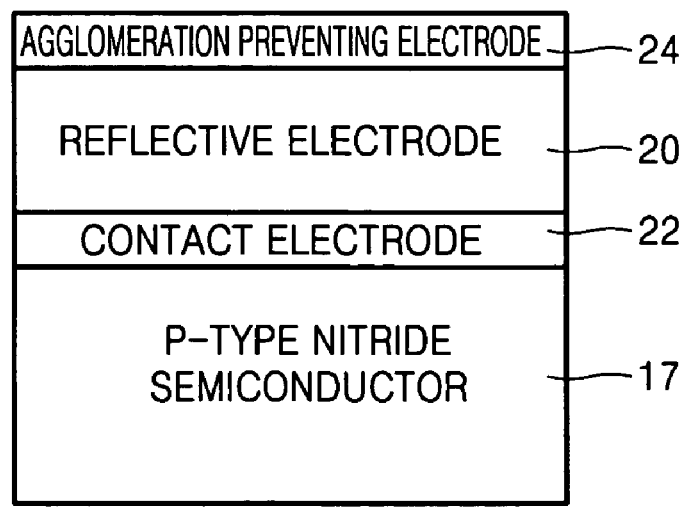

FIGS. 3A and 3B are schematic views of p-type electrodes which are formed on compound semiconductor light emitting device according to embodiments of the present invention. FIG. 3A illustrates an embodiment in which an electrode layer 24 is formed on a conventional reflective electrode 20, and FIG. 3B illustrates another embodiment in which electrode layers 22 and 24 are respectively formed below and above the conventional reflective electrode 20. First, the embodiment illustrated in FIG. 3A will now be described.

In order to emit blue light, a conventional compound semiconductor light emitting device, in particular, a compound semiconductor light emitting device using a group III nitride semiconductor, such as GaN, has a structure including the p-type electrode 20 is stacked on a p-type nitride semiconductor 17. The p-type electrode 20 must act as an electrode and as a reflective layer which reflects light generated by an active layer 15 of the semiconductor light emitting device toward a sapphire substrate 40. For these reasons, the p-type electrode 20 is made of material that has high electrical conductivity and reflects light well. The p-type electrode 20 can be composed of Ag, Rh, Al, Sn, etc. In particular, Ag can be widely used. Because there is a large difference between the surface energies of the materials of the reflective electrode 20 and the p-type nitride semiconductor 17, an agglomeration occurs during an annealing process after the stacking of the electrode. The agglomeration results in an increase of an electrical resistance of the electrode.

In order to prevent this phenomenon, as shown in FIG. 3A, a conductive material having a small difference in surface energy from the p-type nitride semiconductor 17 is additionally stacked on the reflective electrode 20. The conductive material may be Zn, a Zn-alloy, Rh, a Mg-alloy, Au, Ni, a Ni-alloy, doped In oxide, Cu, a Cu-alloy, etc. Ni, Rh, Ni—Zn, Ni—Mg, etc. are examples of materials having the best properties than of these materials.

Since such materials have small differences in surface energy from the p-type nitride semiconductor 17 and have good electrical conductivity, the layer stacked on the reflective layer 20 can simultaneously acts as an agglomeration preventing layer (APL) and an electrodes and will this be referred to as an agglomeration preventing electrode layer 24.

Figure 4A:
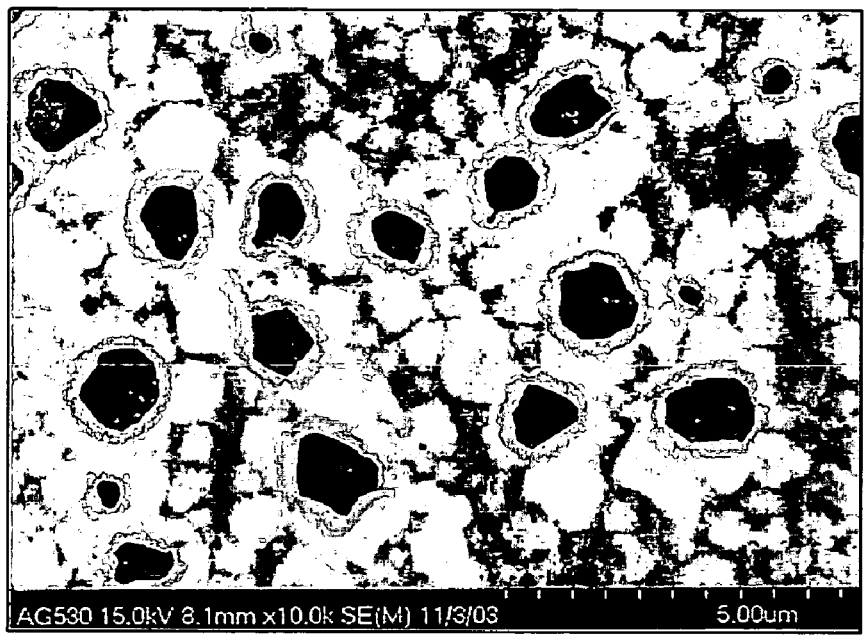
FIGS. 4A through 4D illustrate surfaces of electrodes after an annealing process according to the prior art and an embodiment of the present invention.
Figure 4B:
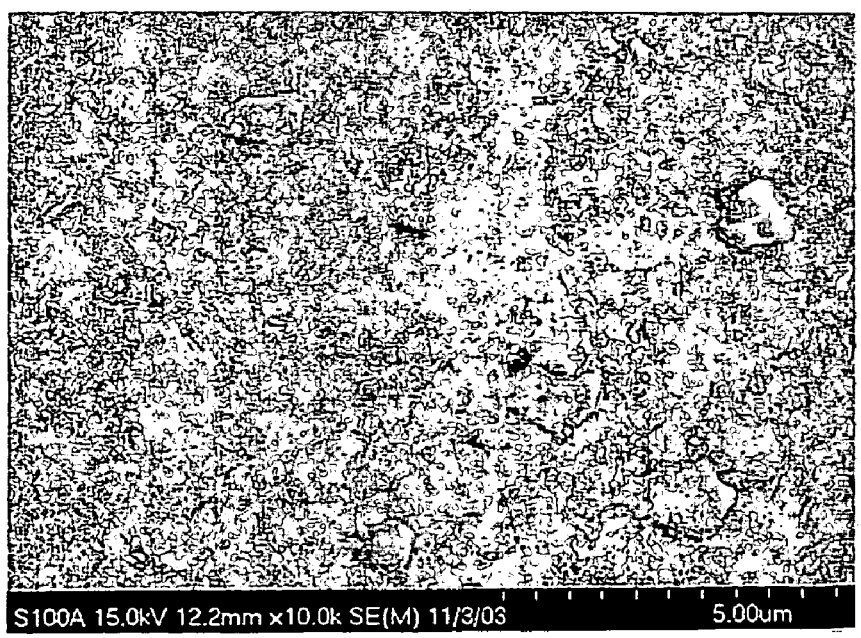
Figure 4C:
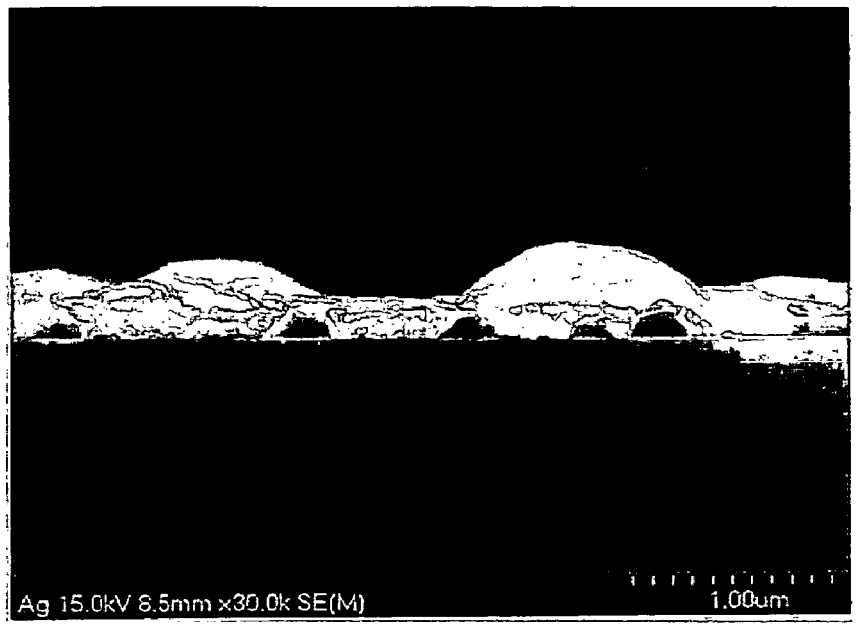
Figure 4D:
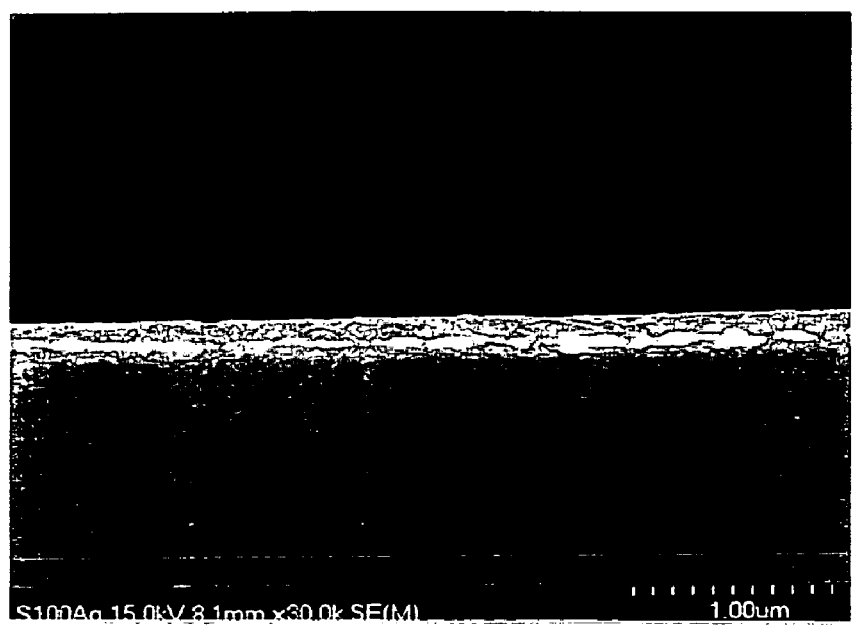

That is, the agglomeration preventing electrode layer 24 is stacked on the reflective electrode 20. Therefore, deformation of the agglomeration preventing electrode layer 24 and the p-type nitride semiconductor 17 that may occur during a following annealing process is similar to each other. Therefore, the agglomeration preventing electrode layer 24 prevents the reflective electrode 20 from being agglomerated during the annealing process, and the surface of the reflective electrode 20 remains flat. FIGS. 4A through 4D illustrate surfaces of the reflective electrodes according to the prior art and an embodiment of the present invention. FIGS. 4A and 4C illustrate the surface of the conventional reflective electrode in which the agglomeration preventing electrode layer 24 is not included. It can be seen that a number of agglomerations occur. Meanwhile, FIGS. 4B and 4D illustrates the surface of the electrode according to an embodiment of the present invention, in which the agglomeration preventing electrode layer 24 is included. Unlike the conventional electrode, it can be seen that almost no agglomerations occur. If the agglomerations do not occur in the reflective electrode 20, the reflectivity is not lowered. In the semiconductor light emitting device using the electrode according to an embodiment of the present invention, degradation of the reflectivity is much less than the prior art.

If the agglomeration preventing electrode layer 24 is too thick, electrical resistance is increased. On the other hand, if the agglomeration preventing electrode layer 24 is too thin, the agglomeration preventing effect disappears. Therefore, it is necessary to properly adjust the thickness of the agglomeration preventing electrode layer 24. The thickness of the agglomeration preventing electrode layer 24 is determined in consideration of a total size of the semiconductor device and a thickness of the reflective electrode 20. The reflective electrode 20 may be 50 nm to 1000 nm thick. In particular, the reflective electrode 20 can be 200 nm thick for most applications. In this case, the agglomeration preventing electrode layer 24 can be 1 nm to 200 nm thick. In particular, the agglomeration preventing electrode layer 24 can be about 20 nm thick.

In a stacking process for forming the reflective electrode 20 and the agglomeration preventing electrode layer 24, metal vapor of the reflective electrode material and metal vapor of the agglomeration preventing electrode layer material are generated by an e-beam produced by an e-beam evaporator and sequentially exposed to the substrate, thereby forming the reflective electrode 20 and the agglomeration preventing electrode layer 24 in a multi-layered thin film structure. Then, an annealing process is performed at a temperature of 300.degree. C. to 600.degree. C. for about 5 minutes. The annealing process can be performed under an atmosphere containing at least oxygen. In the present embodiment, the annealing time and atmosphere is not important and the annealing process may be performed for 30 or more minutes.

Another embodiment in which contact resistance of the electrode is reduced, will now be described.

Referring to FIG. 3A, when only the agglomeration preventing electrode layer 24 is formed above the reflective layer 20, the contact resistance of the electrode is increased. Therefore, referring to FIG. 3B, an additional electrode layer 22 is interposed between a p-type nitride semiconductor 17 and a reflective electrode 20, thereby reducing the contact resistance between the p-type nitride semiconductor 17 and the reflective electrode 20. Hereinafter, the additional electrode layer 22 will be referred to as a contact electrode 22. The contact electrode 22 must have a high transparency. This is because the high conductive electrode layer 22 must transmit the light generated by the active layer 15 of the nitride semiconductor light emitting device, to the reflective electrode 20, and transmit the light reflected from the reflective electrode 20 to the sapphire substrate 40. Materials suitable for this requirement including La-alloys, Ni-alloys, Zn-alloys, Cu-alloys, thermoelectric oxide, doped In oxide, ITO, ZnO, etc. In particular, Zn—Ni, Ni—Mg, Zn—Mg, etc. have the best properties.

If the contact electrode 22 is too thick, the overall reflectivity may be reduced, and if the contact electrode 22 is too thin, the effect of the stacked structure may be reduced. Therefore, it is necessary to properly adjust the thickness of the contact electrode 22. The thickness of the contact electrode 22 is determined in consideration of a total size of the semiconductor device and a thickness of the reflective electrode 20. When the reflective electrode 20 is 200 nm thick, the contact electrode 22 is 1 nm to 200 nm thick. In particular, the contact electrode 22 can be about 3 nm thick.

FIGS. 5A through 8B illustrate current-voltage characteristics of the embodiments of the present invention. Methods of manufacturing electrodes according to embodiments of the present invention will now be described.

Embodiment 1

1) A GaN compound semiconductor device including a p-type semiconductor layer is cleaned in an ultrasonic cleaner contains trichloroethylene, acetone, methanol and distilled water at a temperature of 60° C. for 5 minutes. Then, in order to remove moisture remaining on the GaN compound semiconductor device, a hard baking process is performed at a temperature of 100° C. for 10 minutes.

2) A photoresist layer is coated on the p-type semiconductor layer by spin coating at a speed of 4,500 rpm, and a soft baking process is performed at a temperature of 85° C. for 15 minutes.

3) In order to expose the photoresist width in a predetermined pattern, an exposure mask and the GaN compound semiconductor device are aligned and exposed to an ultraviolet ray of 22.8 mW for 15 minutes. Then, the GaN compound semiconductor device is immersed in a mixed solution of a developer and distilled water in the ratio of 1:4, and is developed for 25 seconds.

4) After the completion of the development, the GaN compound semiconductor device is immersed in a BOE solution for 5 minutes in order to remove pollutants that remain on the GaN compound semiconductor device.

5) After the pollutants are removed, Ag and NiZn are deposited to thickness of 50 nm and 10 nm thick using an e-beam evaporator, respectively. Here, the Ag forms the reflective electrode 20 and the NiZn forms the agglomeration preventing electrode 24.

Figure 5A:
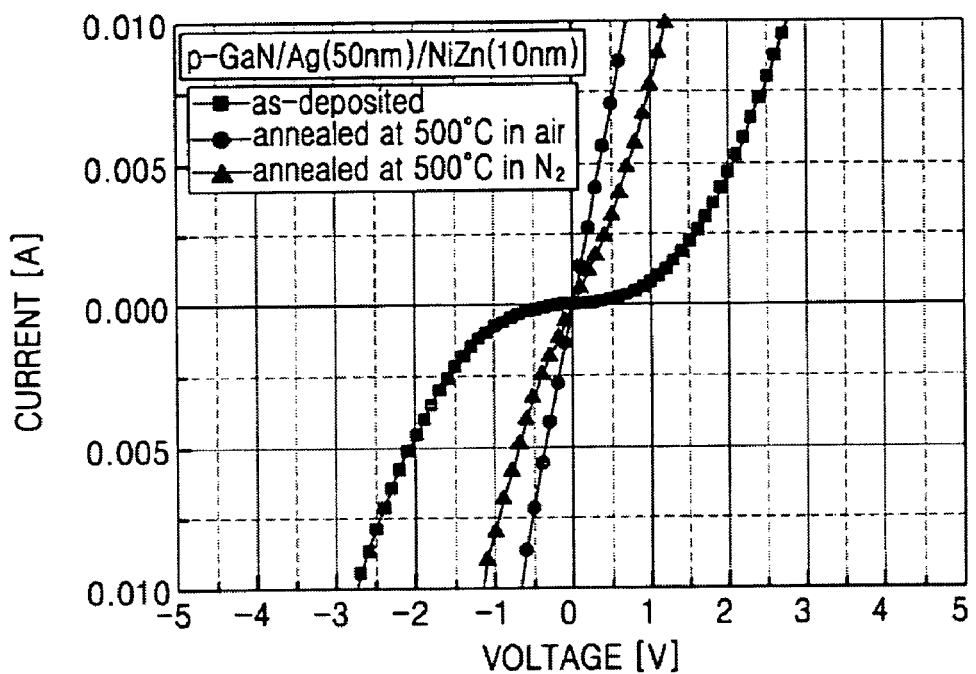
FIG. 5A illustrates I-V characteristics of an electrode of a light emitting device according to a first embodiment of the present invention, in a case where Ag and NiZn layers are stacked on a p-GaN semiconductor layer.

FIG. 5A illustrates electrical properties of the electrode manufactured according to the first embodiment of the present invention. In the FIG. 5A, three graphs illustrate the electrical properties of the electrode before the annealing process (as-deposited), after the annealing process under an air atmosphere at a temperature of 500° C., and after the annealing process under a nitride atmosphere at a temperature of 500° C., respectively. As can be seen, the annealing process under air at the temperature of 500° C. provided the best electrical properties.

The remaining embodiments each include the processes 1) to 4) and the process of depositing the electrode layer using the E-beam evaporator. Since there are differences in materials and thicknesses of the electrode and the annealing temperature, descriptions thereof will be made.

Embodiment 2

Figure 5B:
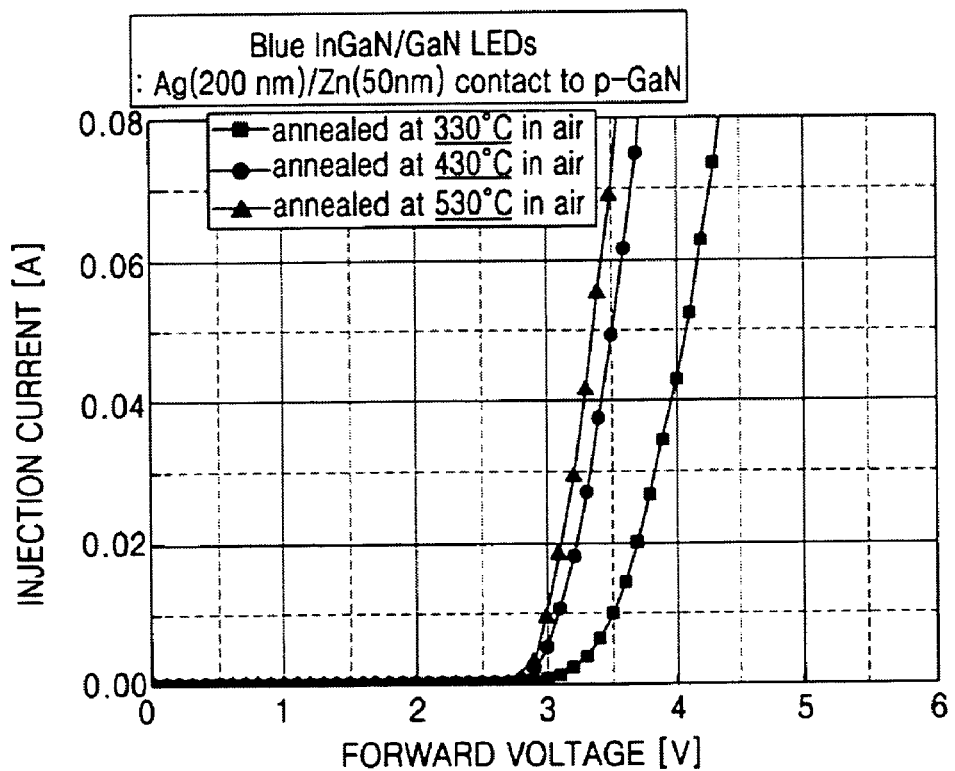
FIG. 5B illustrates I-V characteristics of a light emitting device according to a second embodiment of the present invention, in a case where Ag and Zn layers are stacked on a p-GaN semiconductor layer.

The reflective electrode 20 is formed of Ag to a thickness of 200 nm and the agglomeration preventing electrode layer 24 is formed of Zn to a thickness of 50 nm. After the annealing processes were performed at temperatures of 330° C., 430° C. and 530° C. in air, the tests of the electrical properties of the electrodes were performed. FIG. 5B illustrates the electrical properties of the electrodes manufactured according to the second embodiment. As can be seen, the annealing process performed at the temperature of 530° C. provides the best electrical properties.

Embodiment 3

Figure 6A:
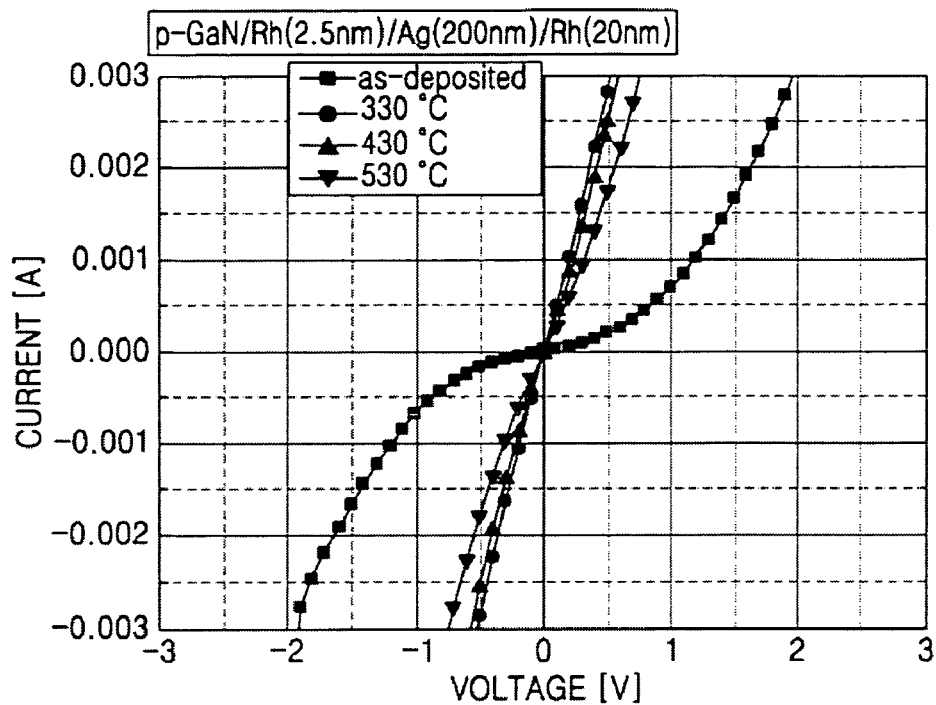
FIG. 6A illustrates I-V characteristics of an electrode of a light emitting device according to a third embodiment of the present invention, in a case where Rh/Ag/Rh layers are stacked on a p-GaN semiconductor layer.
Figure 6B:
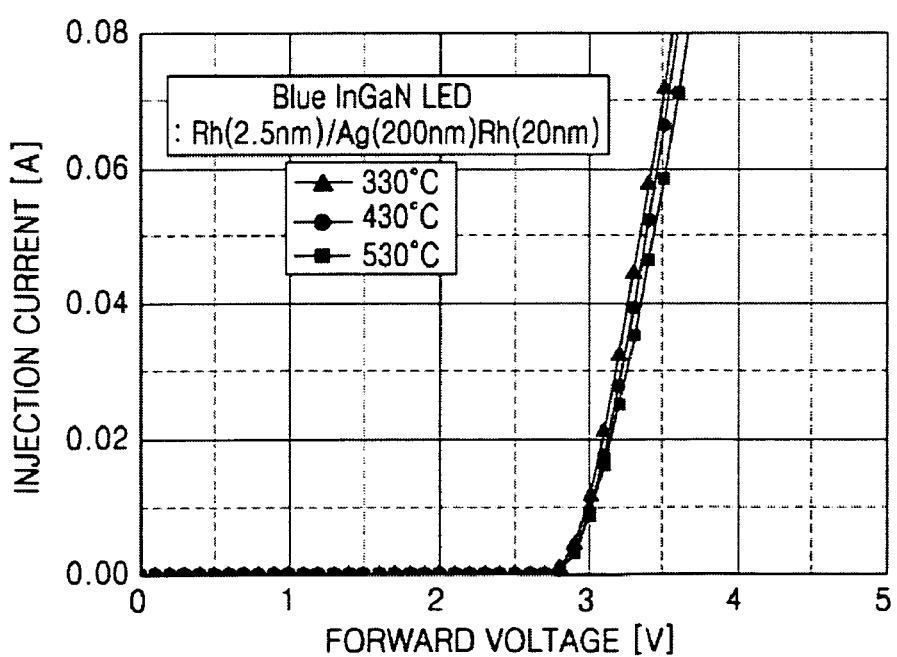
FIG. 6B illustrates I-V characteristics of the light emitting device according to the third embodiment of the present invention.

The contact electrode 22 is formed of Rh to a thickness of 2.5 nm, the reflective electrode 20 is formed of Ag to a thickness of 200 nm, and the agglomeration preventing electrode layer 24 is formed of Rh to a thickness of 20 nm. The electrical properties of the electrode were tested before the annealing process and after the annealing process at 330° C., 430° C. and 530° C., respectively. FIG. 6A illustrates the electrical properties of the electrode, and FIG. 6B illustrates the electrical properties of the semiconductor light emitting device. In this embodiment, a turn-on voltage of the semiconductor light emitting device is 3 V. An injection current changes more rapidly around 3 V when a forward voltage is applied, and thus the electrode has better properties. In the third embodiment, it can be seen that the annealing at the temperature of 330° C. provides the best electrical properties.

Embodiments 4 and 5

Figure 7A:
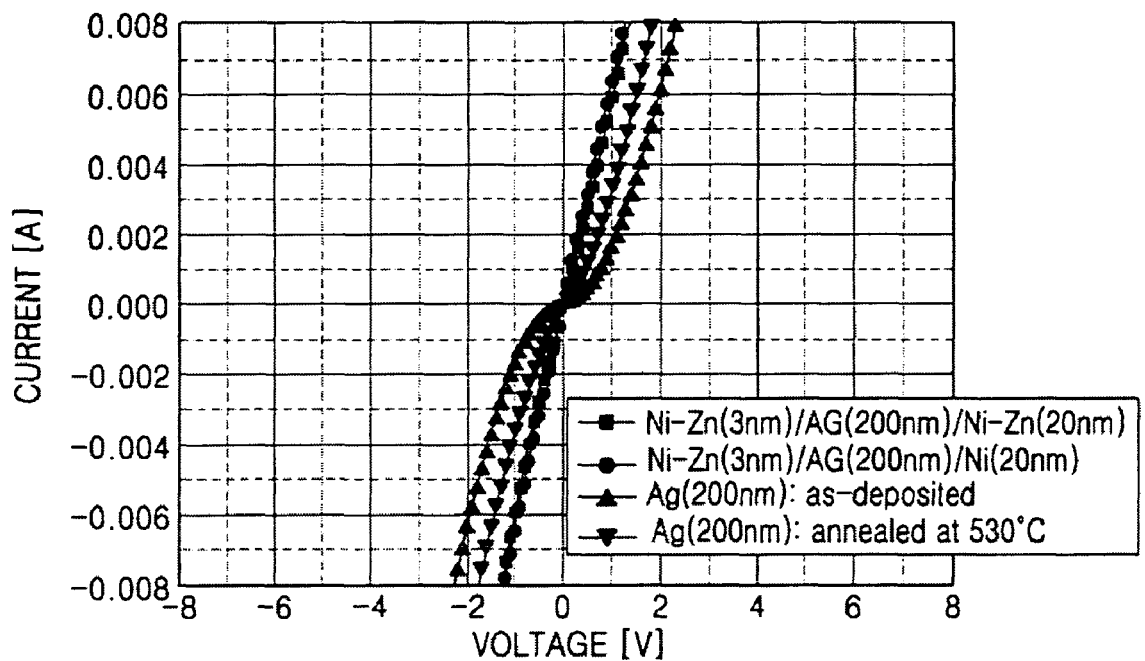
FIG. 7A illustrates I-V characteristics of electrode of the light emitting devices according to fourth and fifth embodiments of the present invention, in cases where Ni—Zn/Ag/Ni—Zn layers are stacked on a p-GaN semiconductor layer and where Ni—Zn/Ag/Ni layers are stacked on a p-GaN semiconductor layer.
Figure 7B:
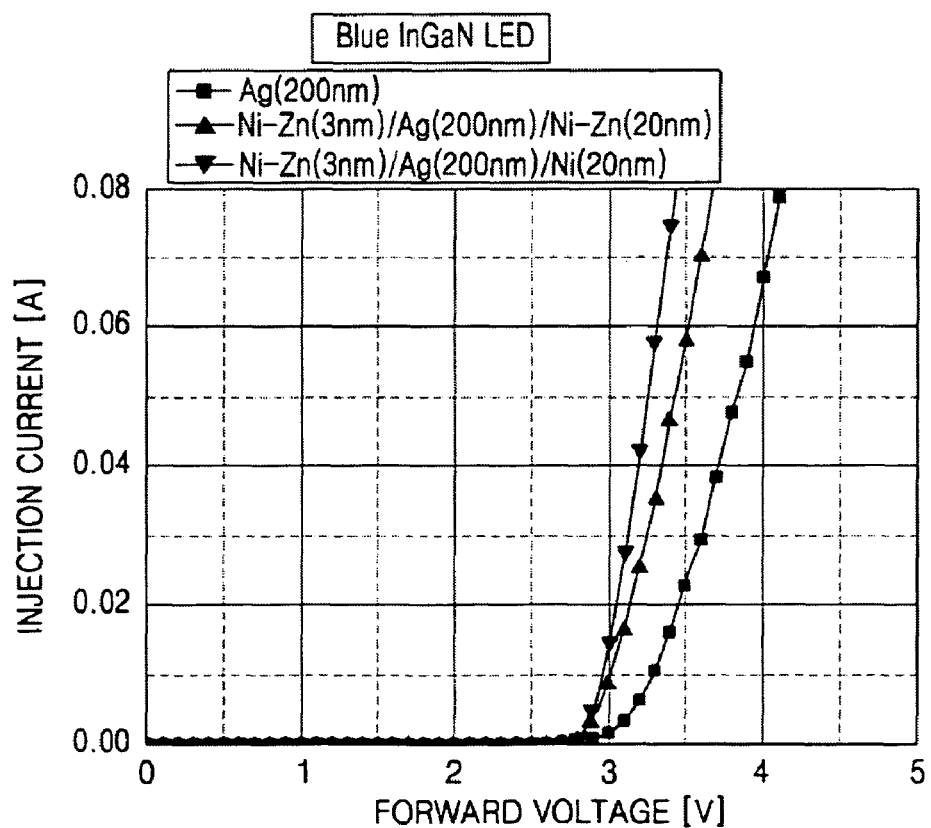
FIG. 7B illustrates I-V characteristics of the light emitting devices according to the fourth and fifth embodiments of the present invention.

In the fourth embodiment, the contact electrode 22 is formed of Ni—Zn alloy to a thickness of 3 nm, the reflective electrode 20 is formed of Ag to a thickness of 200 nm, and the agglomeration preventing electrode 24 is formed of Ni—Zn alloy to a thickness of 20 nm. Also, in the fifth embodiment, the contact electrode 22 is formed of Ni—Zn alloy to a thickness of 3 nm, the reflective electrode 20 is formed of Ag to a thickness of 200 nm, and the agglomeration preventing electrode layer 24 is formed of Ni to a thickness of 20 nm. FIG. 7A illustrates the electrical properties of the electrode according to the prior art and the present embodiments. Here, the electrode according to the prior art includes the reflective electrode 20, which is formed by stacking only Ag. FIG. 7B illustrates the electrical properties of the semiconductor light emitting device according to the prior art and the present embodiment. As can be seen from the graphs, the fourth and fifth embodiments have the more excellent electrical property than the prior art.

Embodiment 6

Figure 8A:
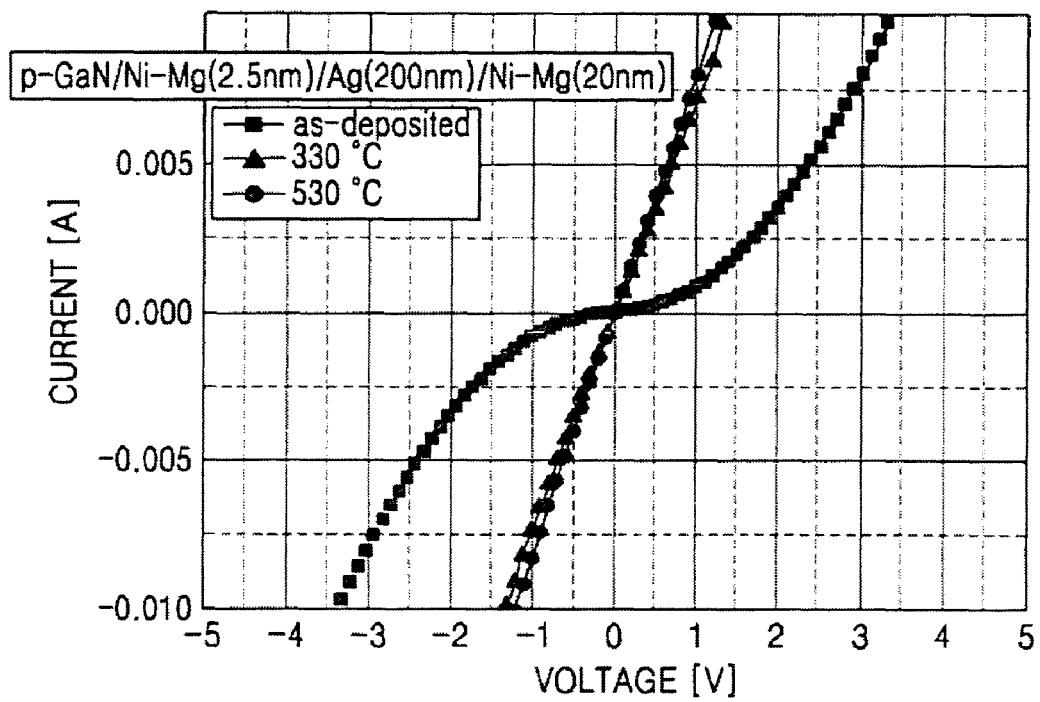
FIG. 8A illustrates I-V characteristics of an electrode of a light emitting device according to a sixth embodiment of the present invention, in a case where Ni—Mg/Ag/Ni—Mg layers are stacked on p-GaN semiconductor layer.
Figure 8B:
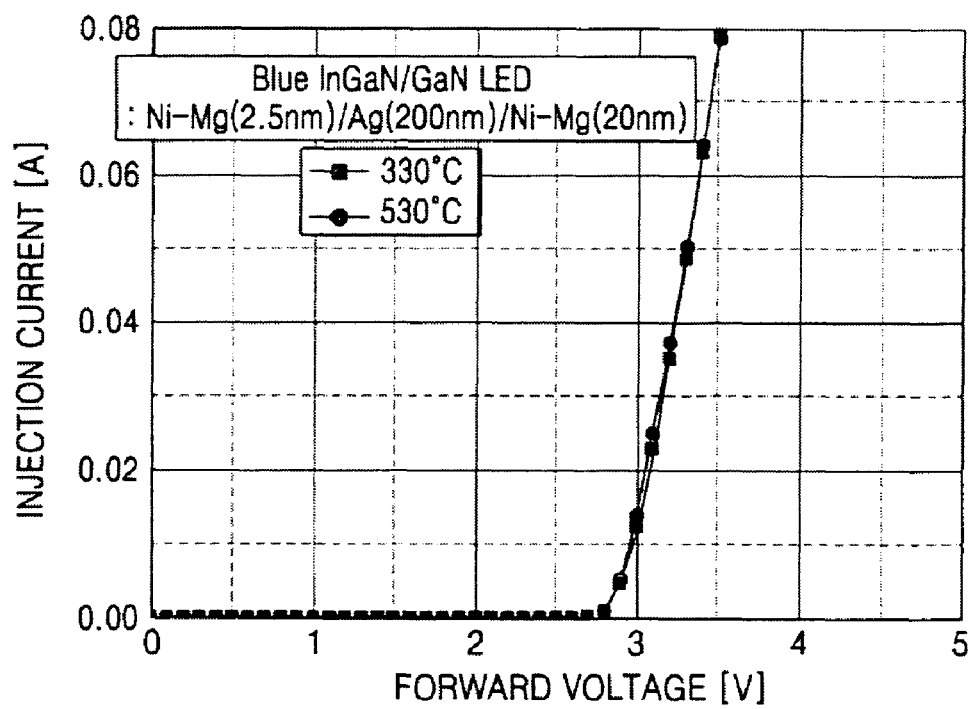
FIG. 8B illustrates I-V characteristics of the light emitting device according to the sixth embodiment of the present invention.

The contact electrode 22 is formed of Ni—Mg alloy to a thickness of 2.5 nm, the reflective electrode 20 is formed of Ag to a thickness of 200 nm, and the agglomeration preventing electrode layer 24 is formed of Ni—Mg alloy to a thickness of 20 nm. The electrical properties were tested before the annealing process and after the annealing process at 330° C. and 530° C. FIG. 8A illustrates the electrical properties of the electrode, and FIG. 8B illustrates the electrical properties of the semiconductor light emitting device. In this sixth embodiment, it can be seen that the annealing at the temperature of 530° C. provides the best electrical property.

Figure 9A:
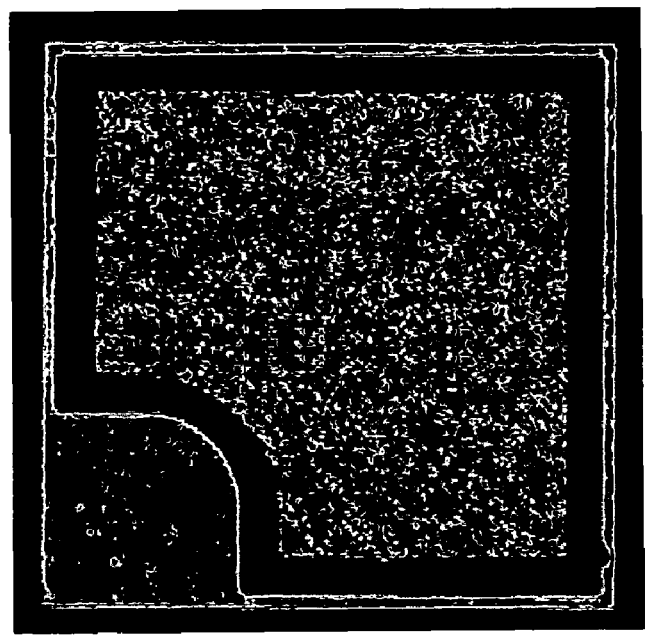
FIGS. 9A through 9C illustrate surfaces of an electrode of the prior art, an electrode on which an agglomeration preventing electrode is formed, and an electrode on which an oxidation preventing electrode is formed, respectively.
Figure 9B:
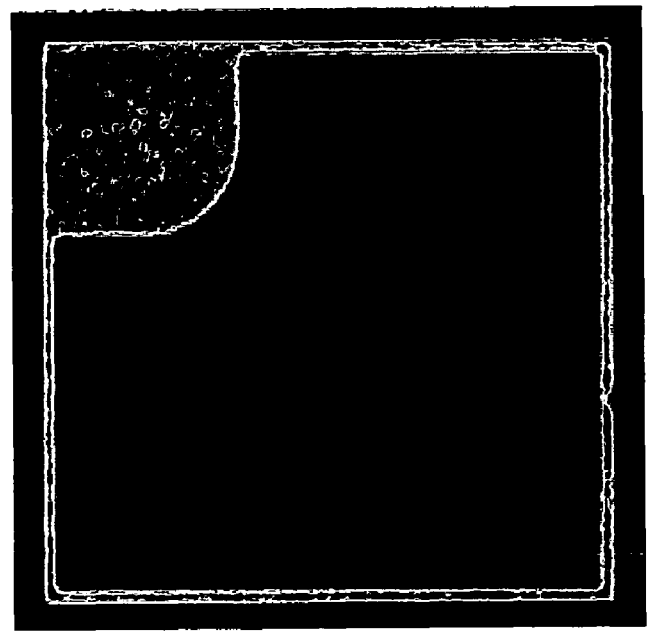

However, when the agglomeration preventing electrode layer 24 is composed of a metal such as Cu, the current-voltage characteristics of the electrode may deteriorate due to oxidation of the surface of the agglomeration preventing electrode layer 24 over time. As described above, when there is no agglomeration preventing electrode layer 24, referring to FIG. 9A, the agglomeration intensely occurs in the reflective electrode 20. If the agglomeration preventing electrode 24 is formed on the reflective electrode 20 in order to prevent the agglomeration of the reflective electrode 20, referring to FIG. 9B, the agglomeration of surface of the electrode almost disappears. However, as time goes by, oxidation of the agglomeration preventing electrode layer 24 partially occurs.

Figure 10:
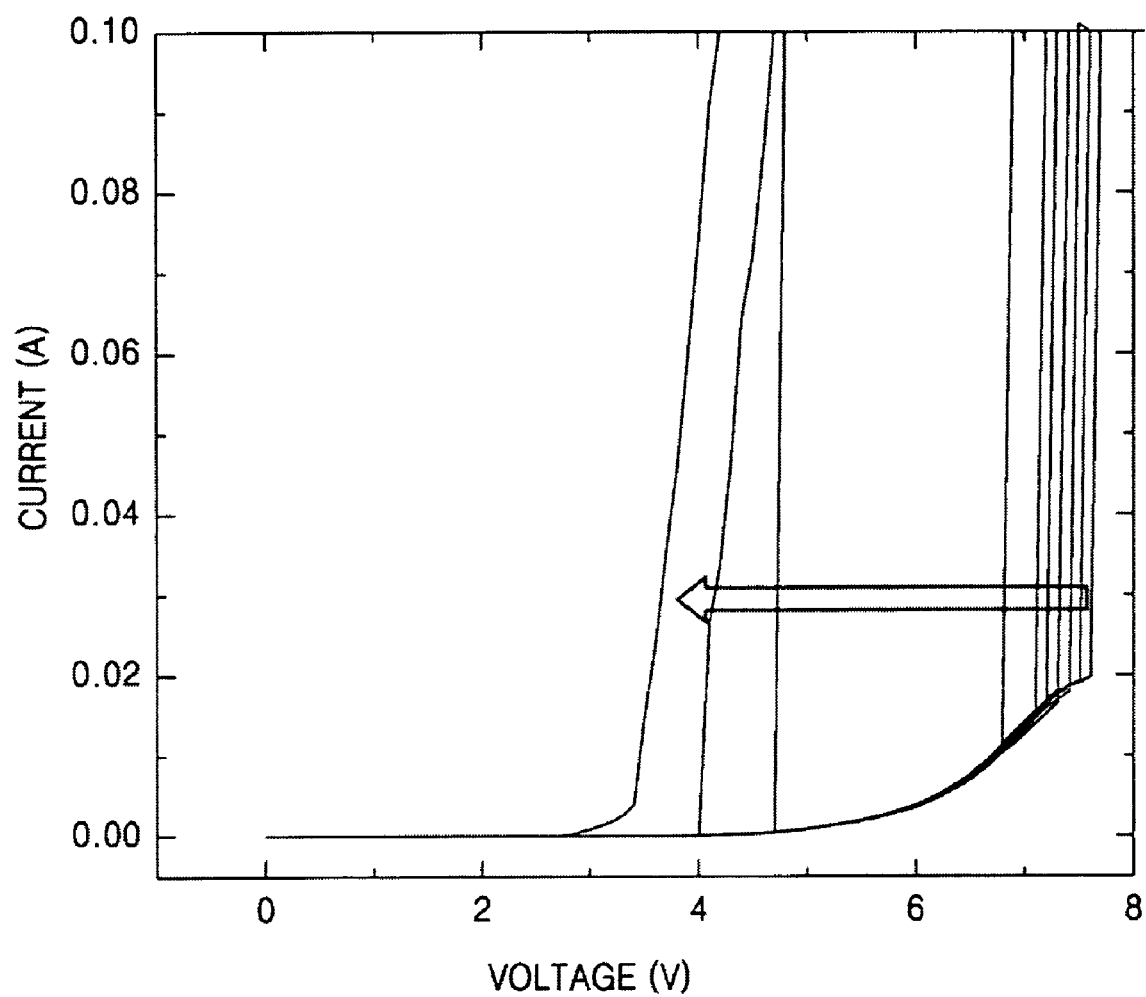
FIG. 10 is a graph illustrating voltage-current characteristics of a semiconductor compound light emitting device according to an embodiment of the present invention when an agglomeration preventing electrode layer is oxidized.

The oxidation of the surface of the agglomeration preventing electrode layer 24 degrades the current-voltage characteristics of the reflective electrode 20 so that an operating voltage of the compound semiconductor light emitting device greatly increases. As a result, as shown in the graph of FIG. 10, when a first voltage is applied after the oxidation of the agglomeration preventing electrode layer 24, the operating voltage becomes almost 8V. Thereafter, whenever a voltage is applied, the operating voltage decreases, thereby improving the current-voltage characteristics. Such oxidation could cause serious problems for the mass-production of goods.

Figure 9C:
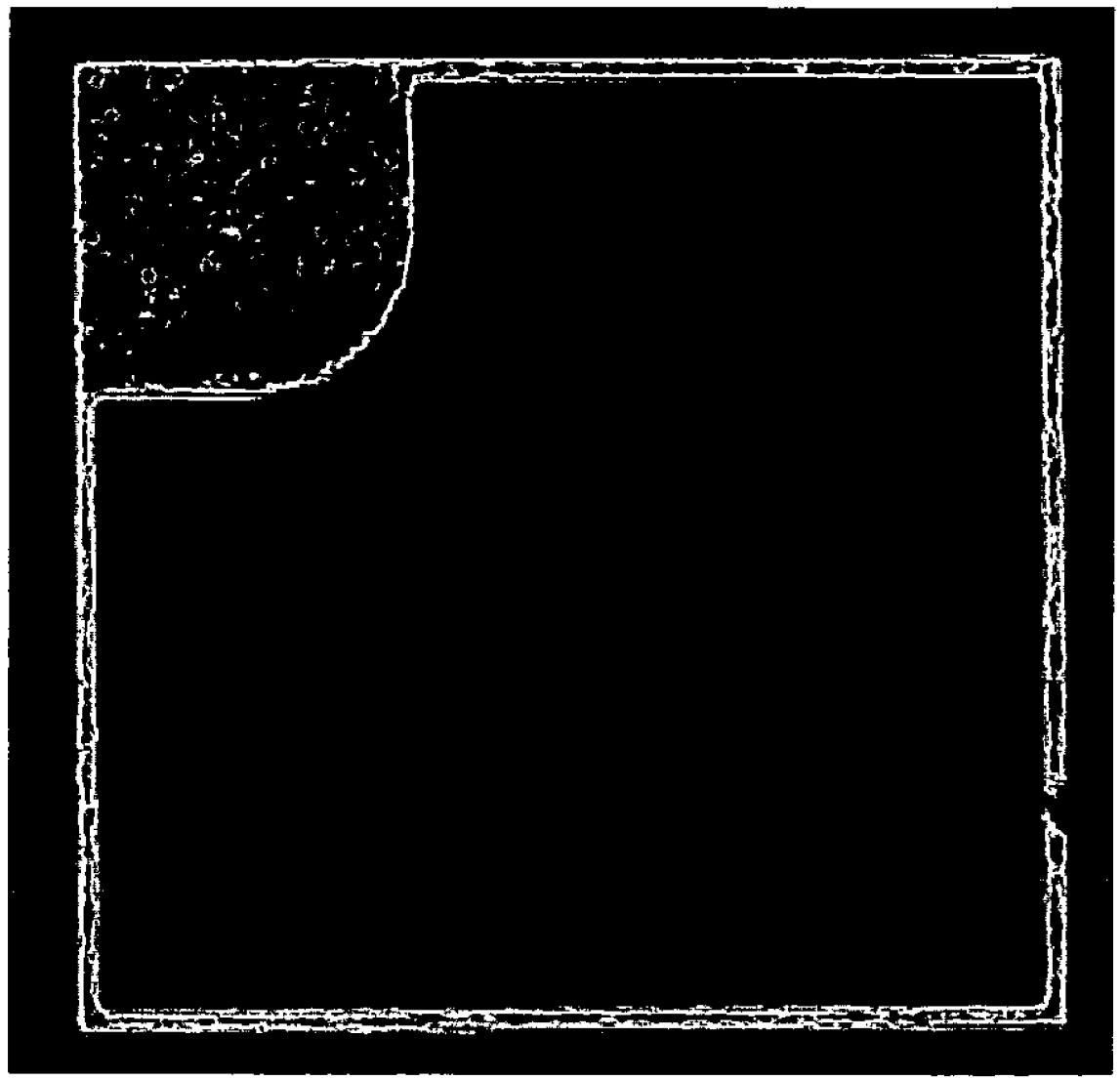
Figure 11A:
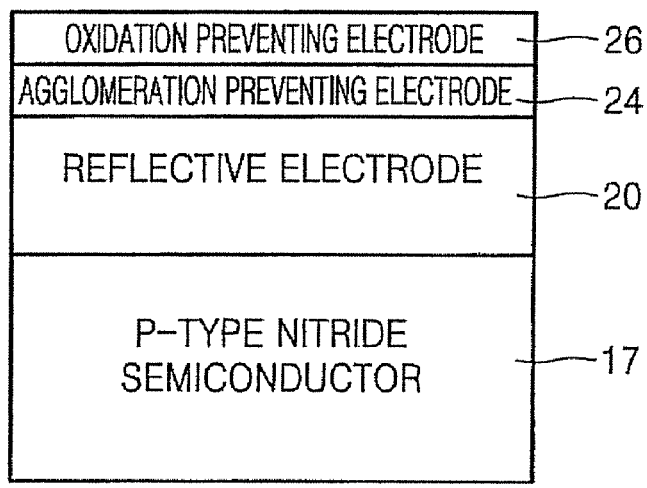
FIGS. 11A and 11B are cross-sectional views illustrating an electrode structure in which an oxidation preventing electrode is formed according to embodiments of the present invention.
Figure 11B:
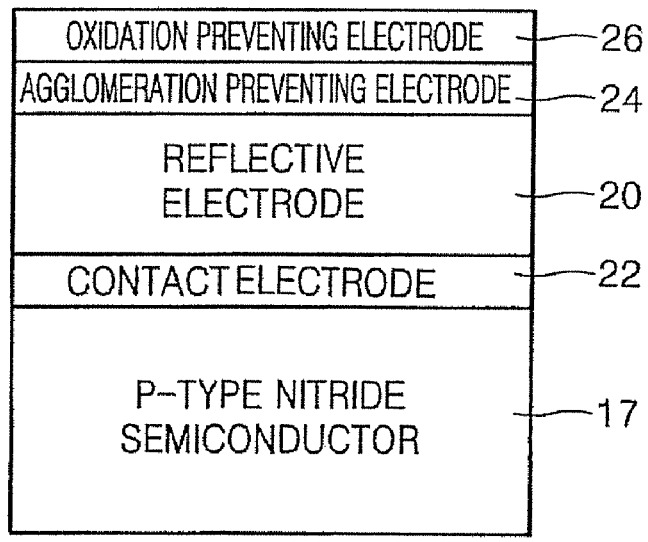

In order to prevent this phenomenon, as shown in FIGS. 11A and 11B, an oxidation preventing electrode 26 is additionally formed on the agglomeration preventing electrode layer 24. FIG. 11A illustrates an electrode structure in which the oxidation preventing electrode 26 is formed on the p-type electrode of the compound semiconductor light emitting device shown in FIG. 3A. FIG. 11B illustrates an electrode structure in which the oxidation preventing electrode 26 is formed on the p-type electrode of the compound semiconductor light emitting device shown in FIG. 3B. In this case, referring to FIG. 9C, it can be seen that the agglomeration of the surface of the reflective electrode 20 disappears, and the oxidation of the agglomeration preventing electrode layer 24 does not occur over time.

The oxidation preventing electrode 26 may be composed of Ru, Ir, TiN, etc. The oxidation preventing electrode layer 26 is 10 nm to 100 nm thick.

Figure 12A:
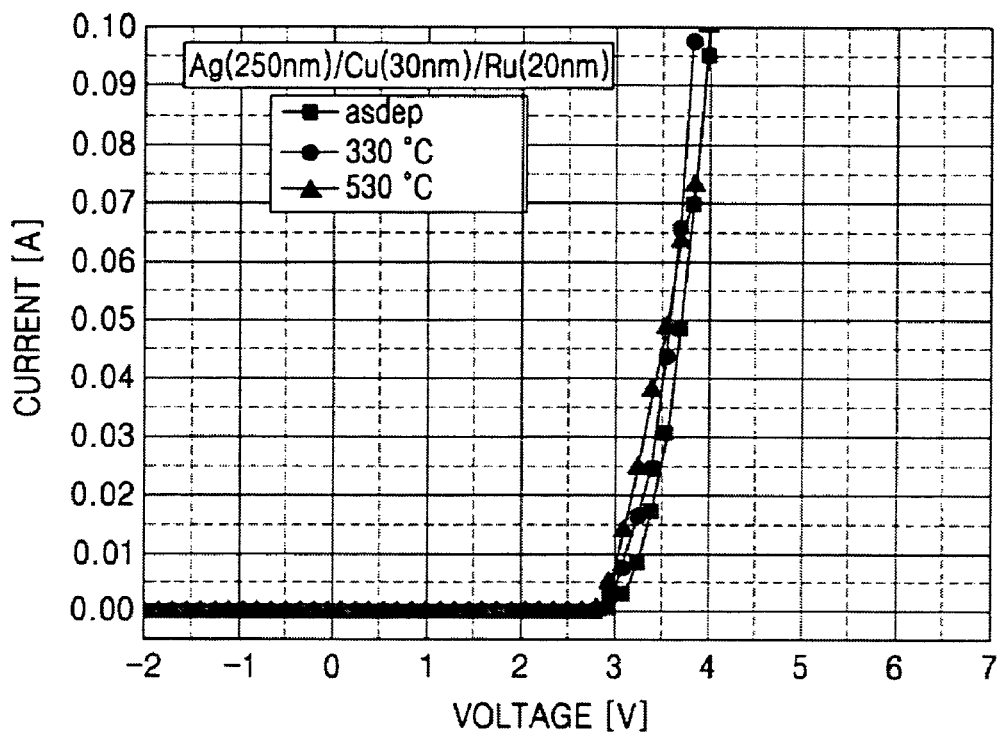
FIGS. 12A and 12B are graphs illustrating voltage-current characteristics of a semiconductor compound light emitting device according to an embodiment of the present invention including an oxidation preventing electrode.
Figure 12B:
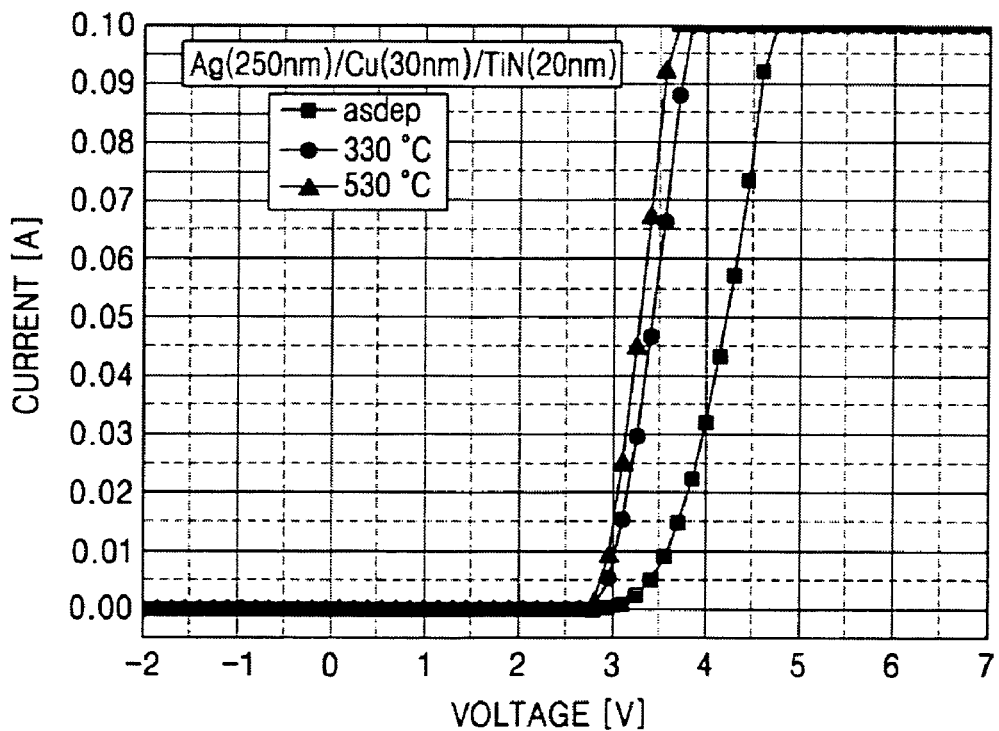

FIG. 12A illustrates current voltage characteristics of the semiconductor compound light emitting device according to an embodiment of the present invention, when the reflective electrode 20 is formed of Ag to a thickness of 250 nm, the agglomeration preventing electrode 24 is formed of Cu to a thickness of 30 nm, and the oxidation preventing electrode 26 is formed of Ru to a thickness of 20 nm. The electrical properties were tested before the annealing process and after the annealing process at 330° C. and 530° C. FIG. 12B illustrates the electrical properties of the semiconductor compound light emitting device according to an embodiment of the present invention when TiN is formed to a thickness of 20 nm instead of Ru. Referring to FIGS. 12A and 12B, it can be seen that after the electrode is formed and a predetermined time goes by, a current changes more rapidly around the operating voltage (3 V) when a first voltage is applied, and the electrode has better current-voltage properties.

According to the embodiments of the present invention, it is possible to prevent the agglomeration from occurring on the surface of a reflective electrode after an annealing process by using an agglomeration preventing electrode layer. Further, it is possible to prevent oxidation of the agglomeration preventing electrode layer by stacking an oxidation preventing electrode layer on the agglomeration preventing electrode layer. According to the embodiments of the present invention, it is possible to obtain an electrode of a semiconductor light emitting device may have very low electric resistance and the semiconductor light emitting device having a low power consumption. Further, according to the embodiments of the present invention, it is possible to stably mass-produce the semiconductor light emitting device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A low resistance multilayer electrode deposited on a p-type semiconductor layer of a compound semiconductor light emitting device including an n-type semiconductor layer, an active layer, and the p-type semiconductor layer, comprising:
a reflective electrode layer which is disposed on the p-type semiconductor layer and reflects light being emitted from the active layer; and an agglomeration preventing electrode which is disposed on the reflective electrode layer in order to prevent the material of the reflective electrode layer being agglomerated within the reflective electrode layer during an annealing process, wherein the agglomeration preventing electrode is composed of a material selected from the group consisting of Zn, Zn-alloy, Mg-alloy, doped In oxide, Cu and Cu-alloy.

2. The low resistance multilayer electrode of claim 1, further comprising a contact electrode layer interposed between the p-type semiconductor layer and the reflective electrode layer in order to reduce a contact resistance between the p-type semiconductor layer and the reflective electrode layer.

3. The low resistance multilayer electrode of claim 2, wherein the contact electrode is composed of a material selected from the group consisting of La-alloy, Ni-alloy, Zn-alloy, Cu-alloy, thermoelectric oxide, doped In oxide, ITO and ZnO.

4. The low resistance multilayer electrode of claim 3, wherein the contact electrode is 0.1 nm to 200 nm thick.

5. The low resistance multilayer electrode of claim 1, wherein the reflective electrode layer is composed of a material selected from the group consisting of Ag, Rh, Al and Sn.

6. The low resistance multilayer electrode of claim 5, wherein the reflective electrode layer is 50 nm to 1000 nm thick.

7. The low resistance multilayer electrode of claim 1, wherein the agglomeration preventing electrode is 1 nm to 500 nm thick.

8. The low resistance multilayer electrode of claim 1, further comprising an oxidation preventing electrode which is disposed on the agglomeration preventing electrode in order to prevent oxidation of the agglomeration preventing electrode.

9. The low resistance multilayer electrode of claim 8, wherein the oxidation preventing electrode is composed of a material selected from the group consisting of Ru, Ir, and TiN.

10. The low resistance multilayer electrode of claim 9, wherein the oxidation preventing electrode is 30 nm to 100 nm thick.

11. The low resistance multilayer electrode of claim 1, wherein the difference between surface energies of the agglomeration preventing electrode and the p-type semiconductor layer is smaller than the difference between surface energies of the reflective electrode layer and the p-type semiconductor layer.

* * * * *